United States Patent
Chung et al.

(10) Patent No.: US 12,205,848 B2
(45) Date of Patent: Jan. 21, 2025

(54) FinFET GATE STRUCTURE AND RELATED METHODS

(71) Applicant: Taiwan Semiconductor Manufacturing Co., Ltd., Hsinchu (TW)

(72) Inventors: Cheng-Ting Chung, Hsinchu (TW); Ching-Wei Tsai, Hsinchu (TW); Kuan-Lun Cheng, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 386 days.

(21) Appl. No.: 17/568,114

(22) Filed: Jan. 4, 2022

(65) Prior Publication Data

US 2022/0122890 A1    Apr. 21, 2022

Related U.S. Application Data

(62) Division of application No. 16/449,014, filed on Jun. 21, 2019, now Pat. No. 11,217,484.

(Continued)

(51) Int. Cl.
 *H01L 29/66* (2006.01)
 *H01L 21/8234* (2006.01)
 *H01L 27/088* (2006.01)

(52) U.S. Cl.
 CPC ........... *H01L 21/823431* (2013.01); *H01L 21/823418* (2013.01); *H01L 21/823437* (2013.01);

(Continued)

(58) Field of Classification Search
 CPC ........ H10B 43/27; H10B 41/27; H10B 41/30; H10B 43/30; H10B 43/40; H10B 43/10; H10B 43/50; H10B 41/35; H10B 41/50; H10B 43/35; H10B 41/41; H10B 41/10; H10B 41/20; H10B 41/40; H10B 41/44; H10B 41/43; H10B 41/42; H10B 43/00; H10B 43/20; H10B 43/23; H10B 51/00; H10B 51/10; H10B 51/20; H10B 51/30; H10B 51/40; H10B 51/50; H10B 53/10; H10B 53/20; H10B 53/22; H10B 63/30; H10B 63/32; H10B 63/34; H10B 63/80; H10B 63/84; H10B 99/00; H10B 99/10; H10B 99/22; H01L 23/5226; H01L 23/528; H01L 29/41775; H01L 29/42324;
 (Continued)

(56) References Cited

U.S. PATENT DOCUMENTS 8,796,666 B1    8/2014 Huang et al.
8,822,243 B2    9/2014 Yan et al.
(Continued)

*Primary Examiner* — Moin M Rahman
(74) *Attorney, Agent, or Firm* — Haynes and Boone, LLP

(57) ABSTRACT

A semiconductor device includes a substrate having a fin element extending therefrom. In some embodiments, a gate structure is formed over the fin element, where the gate structure includes a dielectric layer on the fin element, a metal capping layer disposed over the dielectric layer, and a metal electrode formed over the metal capping layer. In some cases, first sidewall spacers are formed on opposing sidewalls of the metal capping layer and the metal electrode. In various embodiments, the dielectric layer extends laterally underneath the first sidewall spacers to form a dielectric footing region.

20 Claims, 9 Drawing Sheets

Related U.S. Application Data

(60) Provisional application No. 62/753,695, filed on Oct. 31, 2018.

(52) U.S. Cl.
CPC .. *H01L 21/823481* (2013.01); *H01L 27/0886* (2013.01); *H01L 29/66545* (2013.01); *H01L 29/6656* (2013.01)

(58) Field of Classification Search
CPC ........... H01L 29/4234; H01L 21/02532; H01L 21/02636; H01L 21/31111; H01L 21/31155; H01L 21/76802; H01L 21/76877; H01L 21/76897; H01L 29/40114; H01L 29/40117; H01L 29/66545; H01L 29/7883; H01L 21/76831; H01L 21/76805; H01L 29/78; H01L 21/823431; H01L 21/823481; H01L 21/823418; H01L 21/823437; H01L 27/0886; H01L 29/6656; H01L 29/517; H01L 29/513; H01L 21/82345; H01L 29/66795; H01L 21/823821; H01L 21/823807; H01L 21/823857; H01L 21/823864; H01L 21/845; H01L 29/1054; H01L 29/66803; H01L 29/66818; H01L 29/7853; H01L 29/7854; H01L 29/51; H01L 29/10; H01L 21/28; H01L 29/785; H01L 21/28194
See application file for complete search history.

(56) References Cited

U.S. PATENT DOCUMENTS

| | | | |
|---|---|---|---|
| 8,987,142 | B2 | 3/2015 | Lee et al. |
| 9,093,530 | B2 | 4/2015 | Huang et al. |
| 9,053,279 | B2 | 6/2015 | Chang et al. |
| 9,099,530 | B2 | 8/2015 | Lin et al. |
| 9,153,478 | B2 | 10/2015 | Liu et al. |
| 9,501,601 | B2 | 11/2016 | Chang et al. |
| 9,548,303 | B2 | 1/2017 | Lee et al. |
| 9,876,114 | B2 | 1/2018 | JanJian et al. |
| 2016/0365426 | A1* | 12/2016 | Ching ................ H01L 29/6653 |
| 2017/0133489 | A1 | 5/2017 | Zhou |
| 2017/0141220 | A1 | 5/2017 | Ching et al. |
| 2017/0352740 | A1 | 12/2017 | Lin et al. |
| 2018/0096894 | A1* | 4/2018 | Smith ............. H01L 21/823468 |
| 2018/0331100 | A1 | 11/2018 | Lee et al. |
| 2018/0350932 | A1* | 12/2018 | Liu ................... H01L 21/32133 |
| 2018/0350934 | A1 | 12/2018 | Liou et al. |
| 2019/0043725 | A1* | 2/2019 | Chang ................ H01L 29/6656 |

* cited by examiner

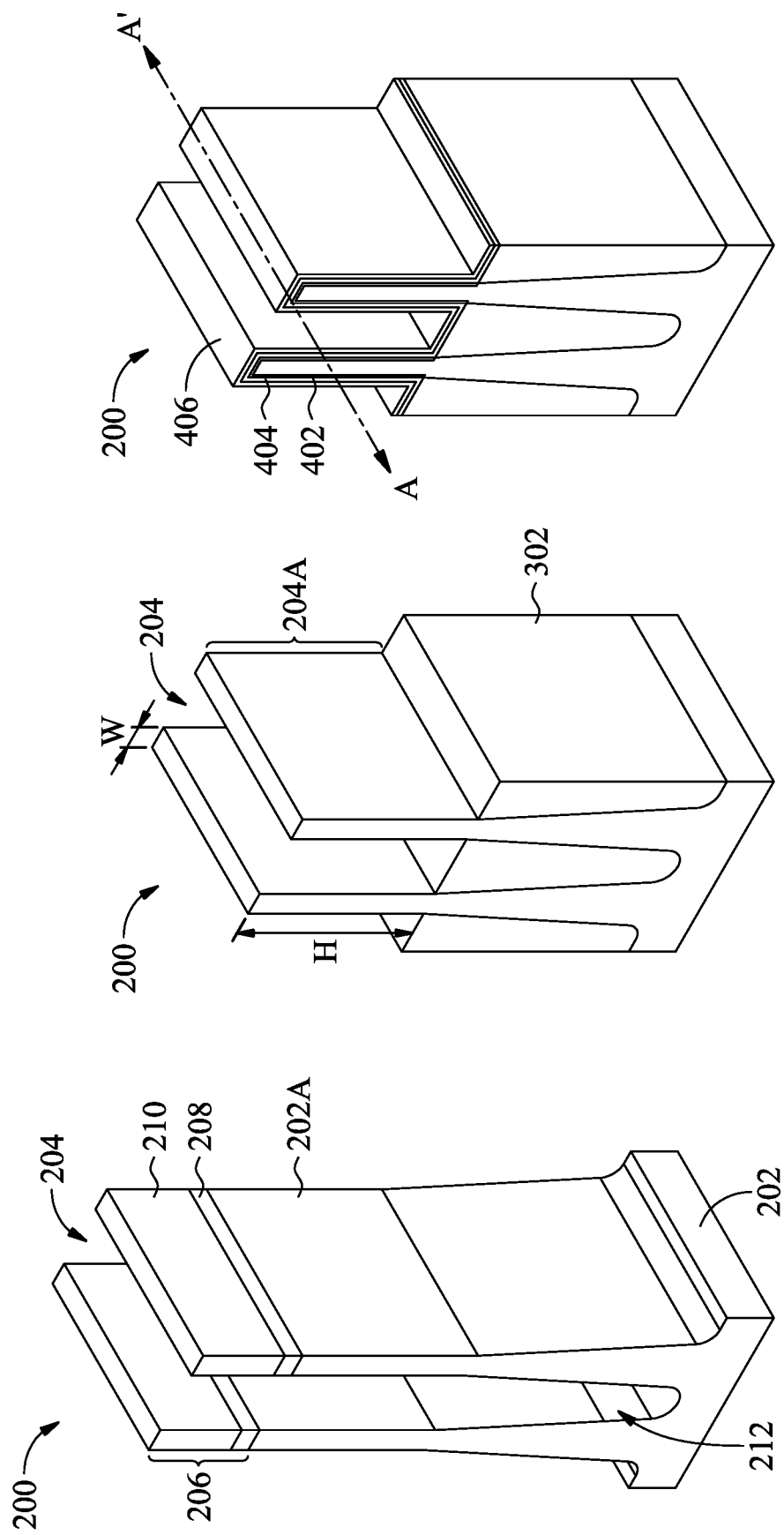

FinFET GATE STRUCTURE AND RELATED METHODS

PRIORITY DATA

This application is a Divisional Patent Application of U.S. patent application Ser. No. 16/449,014 filed Jun. 21, 2019, issuing as U.S. Pat. No. 11,217,484, and which claims the benefit of U.S. Provisional Application No. 62/753,695, filed Oct. 31, 2018, the entire disclosures of which are incorporated herein by reference.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs.

In various conventional processes, a device gate stack may be formed using a high-K-last process or a high-K-first process. In some existing implementations, devices made using a high-K-first process may exhibit larger drain current (Ideff) degradation (e.g., as compared to devices fabricated using a high-K-last process) due to worse metal gate-to-channel coupling. However, devices fabricated using a high-K-first process may also provide a better process window and lower gate-to-drain capacitance (Cgd) as compared to devices fabricated using a high-K-last process.

Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, 9, 10, 11, and 12 are isometric views of an embodiment of a device 200 according to aspects of the method of FIG. 1;

DETAILED DESCRIPTION

Figure 1:
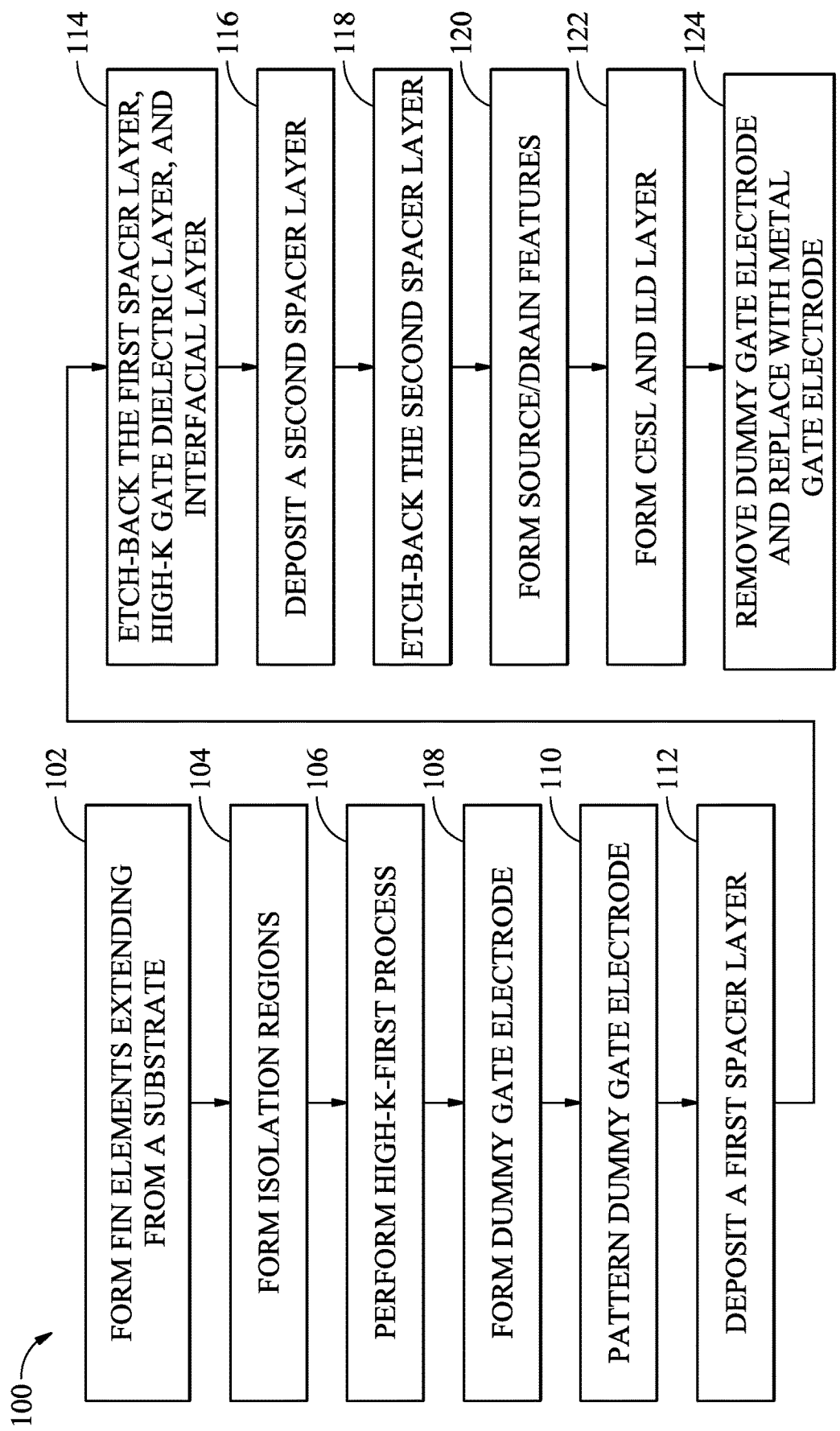
FIG. 1 is a flow chart of a method of fabricating a FinFET device or portion thereof according to one or more aspects of the present disclosure.
Figure 5A:
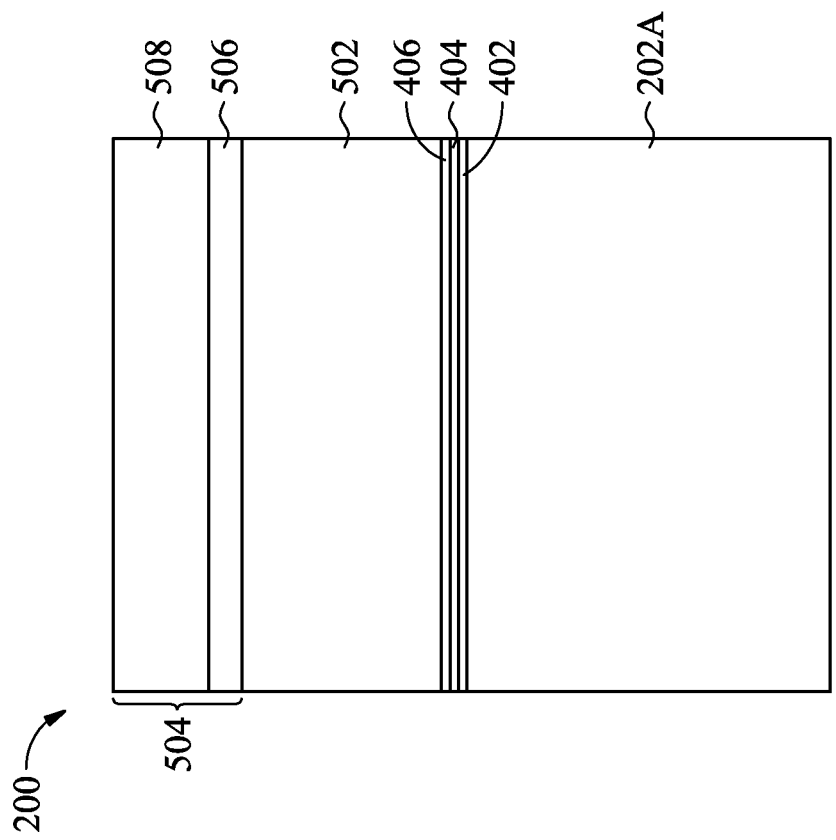
FIGS. 5A, 6A, 7A, 8A, and 12A are cross-section views, corresponding to respective isometric views listed above, of an embodiment of the device 200 according to aspects of the method of FIG. 1.
Figure 5:
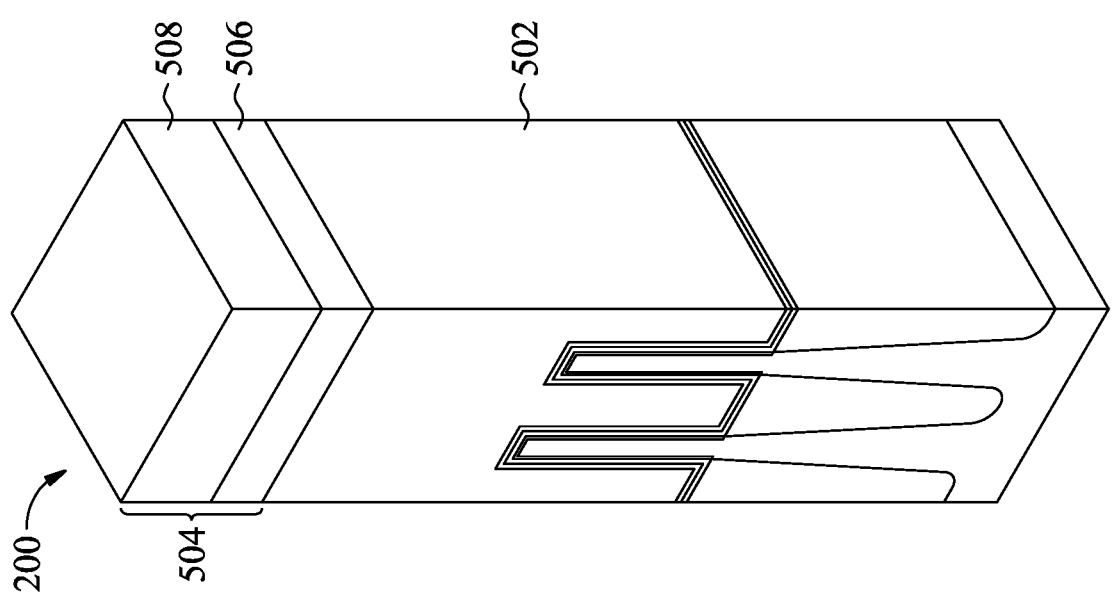
Figure 6A:
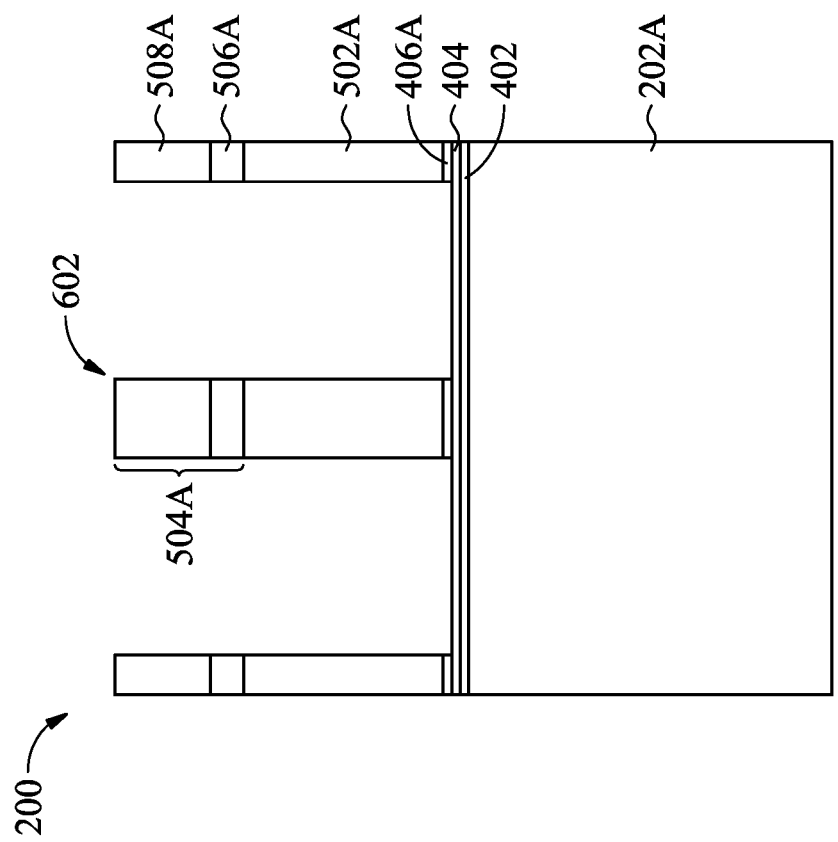
Figure 6:
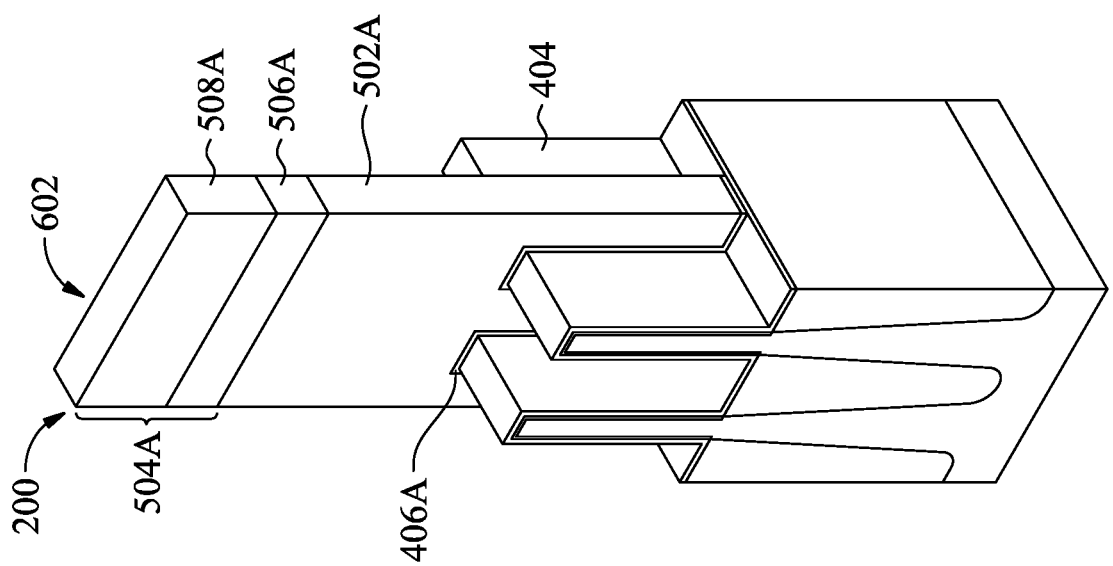
Figure 7A:
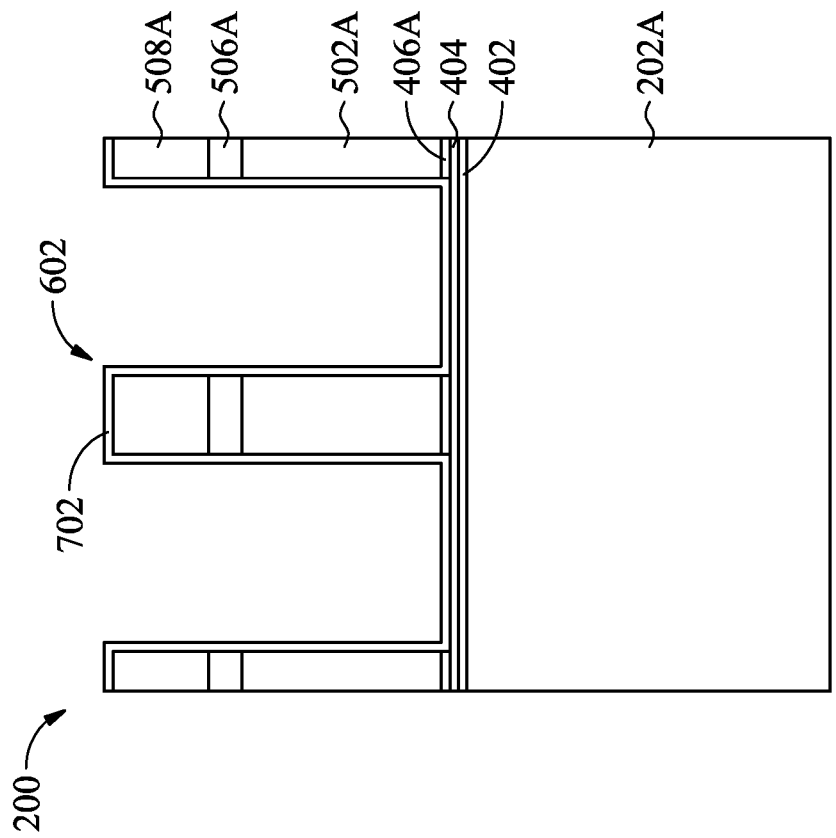
Figure 7:
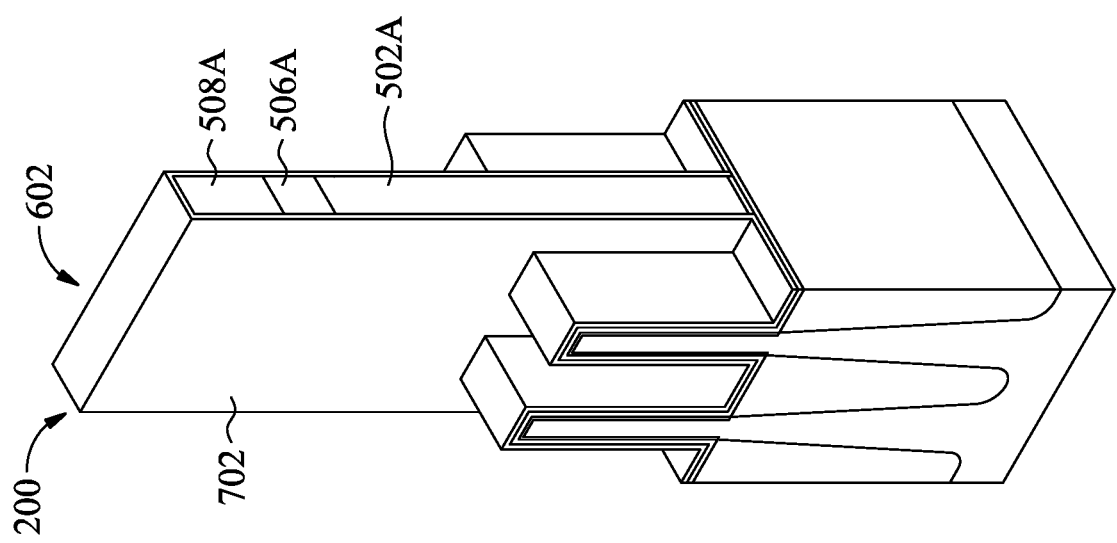

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other examples of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

The present disclosure is generally related to semiconductor devices and fabrication methods, and more particularly to the formation of devices (e.g., FinFETs) fabricated using a high-K-first process and including a high-K footing, as described in more detail below. High-K gate dielectrics, as used and described herein, include dielectric materials having a high dielectric constant, for example, greater than that of thermal silicon oxide (~3.9). Generally, a device gate stack may be formed using a high-K-last process or a high-K-first process. In some existing implementations, devices made using a high-K-first process may exhibit larger drain current (Ideff) degradation (e.g., as compared to devices fabricated using a high-K-last process) due to worse metal gate-to-channel coupling. However, devices fabricated using a high-K-first process may also provide a better process window and lower gate-to-drain capacitance (Cgd) as compared to devices fabricated using a high-K-last process. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, various embodiments provide a method and related structure for improving a gate-to-channel fringing field for devices fabricated using a high-K-first process by employing a high-K footing that extends under a gate stack spacer. In some embodiments, the high-K-first process disclosed herein provides the high-K footing having a structure including an interfacial layer and a high-K dielectric layer that extend laterally under at least one sidewall spacer of the gate stack. In some examples, the interfacial layer and the high-K dielectric layer extend laterally under the sidewall spacer by about 1-8 nm, which provides for coupling between a gate electrode and an underlying channel region substantially across the length of the channel region. Stated another way, the length of the high-K footing may be selected to provide a capacitive fringing field between a gate electrode and the underlying channel region that reaches substantially to ends of the channel region to provide enhanced gate-to-channel coupling. In accordance with some examples, devices fabricated using a high-K-first process and with such a high-K footing may exhibit a drain current (Ideff) that is comparable to that of devices fabricated using a high-K-last process. In some embodiments, the high-K footing described herein may be defined by a self-aligned spacer process. In addition, in some cases, the high-K footing may be formed under a gate sidewall spacer and around a fin structure, as described below. Generally, aspects of the present disclosure provide a process that is compatible with a conventional seal spacer process, provide for tuning a length of the high-K footing by tuning an offset spacer (e.g., sidewall spacer) thickness, and the drive current of high-K-first devices including the disclosed high-K footing structure is improved due to the improved gate-to-channel fringing field. Further, the devices structures and related methods discussed herein simultaneously offer advantages of both a high-K-first process (e.g., better process window and lower Cgd) and a high-K-last process (e.g., improved gate-to-channel coupling and Ideff). Additional details of embodiments of the present disclosure are provided below, and additional benefits and/or other advantages will become apparent to those skilled in the art having benefit of the present disclosure.

Figure 12:
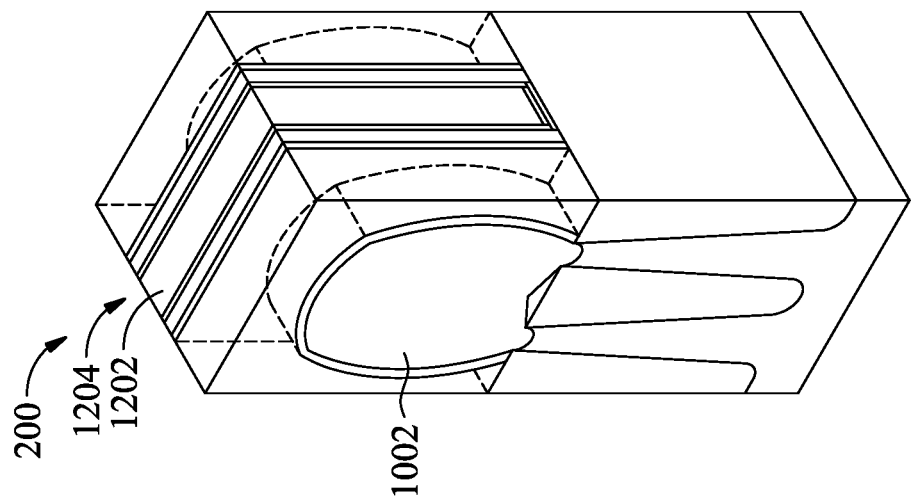
Figure 11:
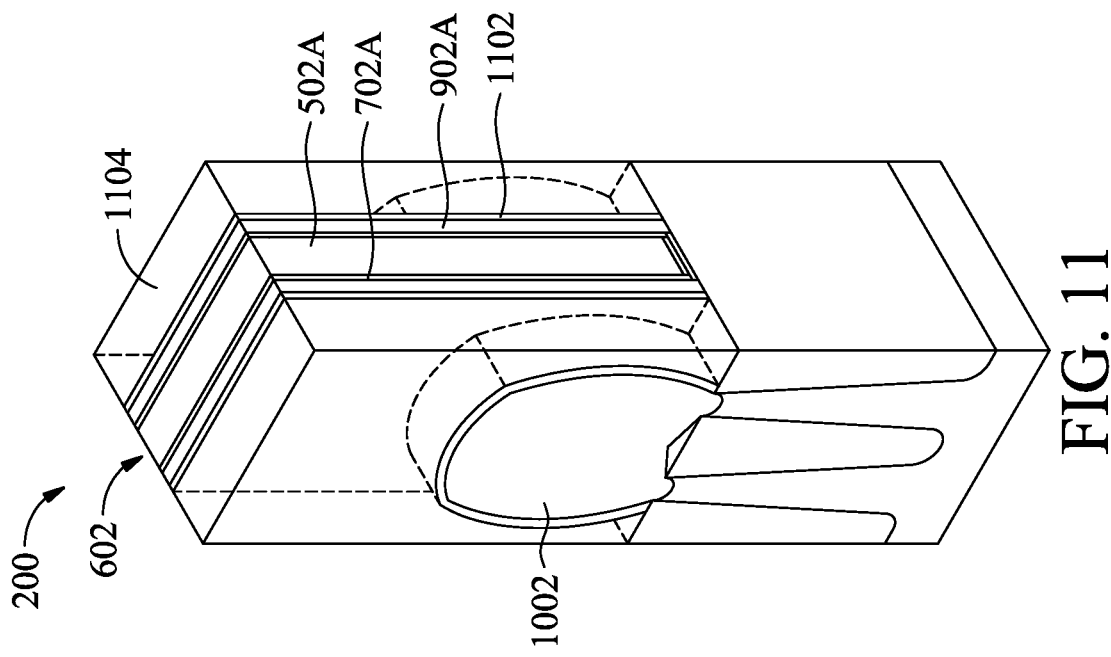
Figures 12A, 12B:
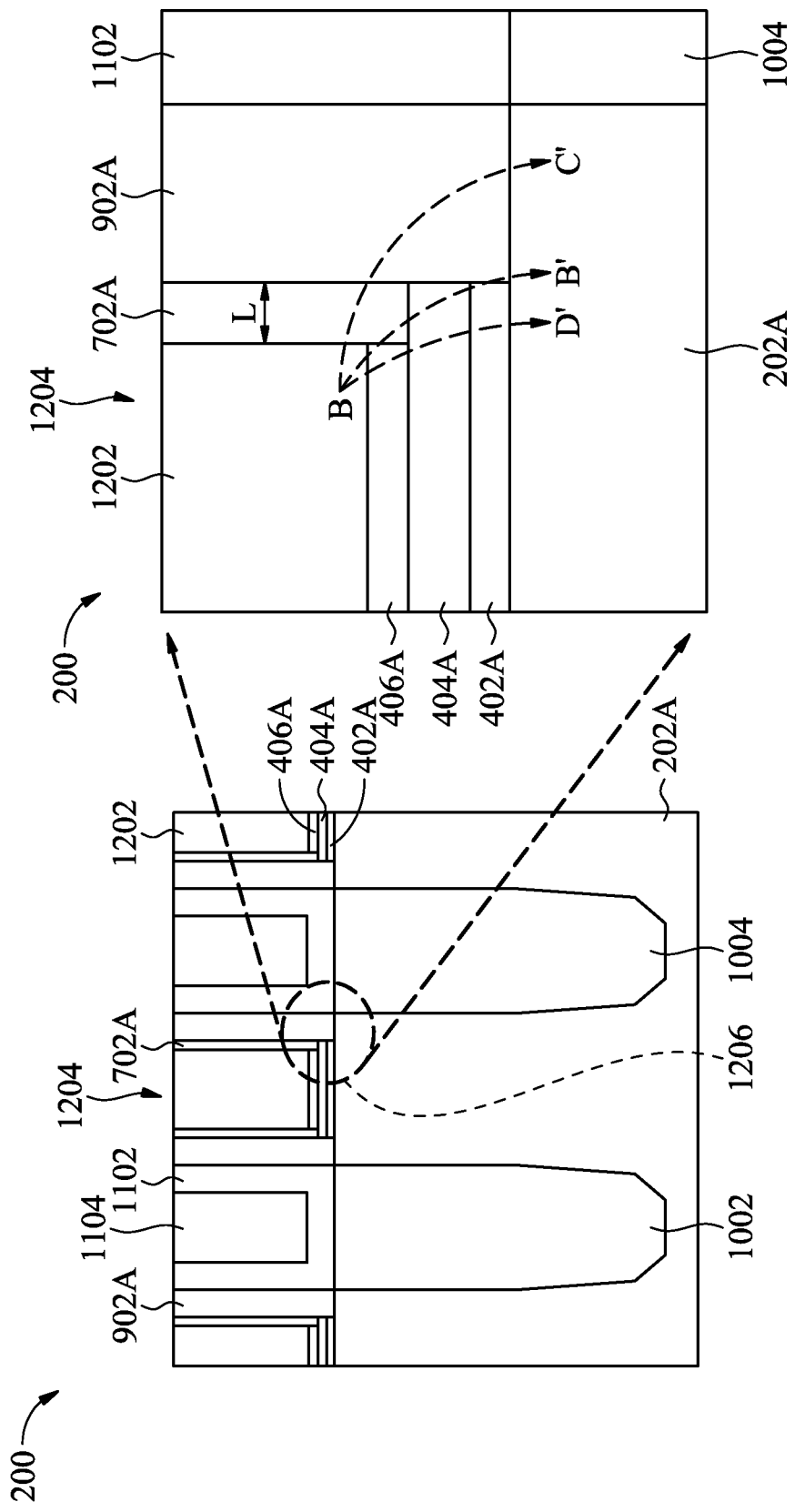
FIG. 12B illustrates a zoomed-in view of a region of the device 200 of FIG. 12A, according to some embodiments.

Referring now to FIG. 1, illustrated therein is a method 100 for fabricating a device including a high-K footing, in accordance with some embodiments. It is understood that the method 100 includes steps having features of a complementary metal-oxide-semiconductor (CMOS) technology process flow and thus, are only described briefly herein. Additional steps may be performed before, after, and/or during the method 100. FIGS. 2, 3, 4, 5, 6, 7, 8, 9, 10, 11, and 12 provide isometric views of an embodiment of a semiconductor device 200 according to various stages of the method 100 of FIG. 1. FIGS. 5A, 6A, 7A, 8A, and 12A are cross-section views (e.g., along an exemplary plane A-A', as shown in FIG. 4), corresponding to respective isometric views listed above, of an embodiment of the semiconductor device 200 according to various stages of the method 100 of FIG. 1. FIG. 12B illustrates a zoomed-in view of a region of the device 200 of FIG. 12A, according to some embodiments. Further, the semiconductor device 200 may include various other devices and features, such as other types of devices such as additional transistors, bipolar junction transistors, resistors, capacitors, inductors, diodes, fuses, static random-access memory (SRAM) and/or other logic circuits, etc., but is simplified for a better understanding of the inventive concepts of the present disclosure. In some embodiments, the semiconductor device 200 includes a plurality of semiconductor devices (e.g., transistors), including PFETs, NFETs, etc., which may be interconnected. Moreover, it is noted that the process steps of method 100, including any descriptions given with reference to the figures are merely exemplary and are not intended to be limiting beyond what is specifically recited in the claims that follow.

The method 100 begins at block 102 where fin elements, used for subsequent FinFET formation, are formed on a substrate. With reference to the example of FIG. 2, in an embodiment of block 102, a plurality of fin elements 204 extending from a substrate 202 are formed. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include one or more epitaxial layers (epi-layers), may be strained for performance enhancement, may include a silicon-on-insulator (SOI) structure, and/or have other suitable enhancement features.

In some embodiments, an anti-punch through (APT) implant may be performed (e.g., into the substrate 202) prior to formation of the fin elements 204. In some cases, and also prior to formation of the fin elements 204, a hard mask (HM) layer may be formed over the substrate 202. The HM layer may include an oxide layer (e.g., a pad oxide layer that may include $SiO_2$) and a nitride layer (e.g., a pad nitride layer that may include $Si_3N_4$) formed over the oxide layer. In some examples, the oxide layer may include thermally grown oxide, CVD-deposited oxide, and/or ALD-deposited oxide, and the nitride layer may include a nitride layer deposited by CVD or other suitable technique. By way of example, the oxide layer of the HM layer may have a thickness of between approximately 5 nm and approximately 40 nm. In some embodiments, the nitride layer of the HM layer may have a thickness of between approximately 20 nm and approximately 160 nm.

In various embodiments, each of the fin elements 204 may include a substrate portion 202A formed from the substrate 202 and an HM layer portion 206. In some examples, the HM layer portion 206 may include an oxide layer portion 208 and a nitride layer portion 210 formed from the HM layer deposited over the substrate 202 prior to formation of the fin elements 204, as described above.

The fins 204, like the substrate 202, may include silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 204 may be fabricated using suitable processes including photolithography and etch processes. The photolithography process may include forming a photoresist layer over the substrate 202 (e.g., over an HM layer formed over the substrate 202), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers formed thereupon, while an etch process forms trenches 212 in unprotected regions through the HM layer and into the substrate 202, thereby leaving the plurality of extending fins 204 (e.g., each including the substrate portion 202A, the oxide layer portion 208, and the nitride layer portion 210, as described above). The trenches 212 may be etched using a dry etch (e.g., reactive ion etching), a wet etch, and/or other suitable processes. Numerous other embodiments of methods to form the fins 204 on the substrate 202 may also be used. In some embodiments, the substrate portion 202A will serve as a FinFET device channel.

The method 100 then proceeds to block 104 where isolation regions are formed. With reference to the example of FIGS. 2 and 3, in an embodiment of block 104, a plurality of isolation regions 302 are formed. In some embodiments, the plurality of isolation regions 302 may include a plurality of shallow trench isolation (STI) features including a dielectric material. By way of example, the dielectric material is first deposited over the substrate 202, filling the trenches 212 with the dielectric material. In some embodiments, the dielectric material may include $SiO_2$, silicon nitride, silicon oxynitride, fluorine-doped silicate glass (FSG), a low-k dielectric, combinations thereof, and/or other suitable materials known in the art. In various examples, the dielectric material may be deposited by a CVD process, a subatmospheric CVD (SACVD) process, a flowable CVD process, an ALD process, a PVD process, or other suitable process. In some embodiments, after deposition of the dielectric material, the device 200 may be annealed to improve the quality of the dielectric material. In some embodiments, a field oxide, a LOCOS feature, and/or other suitable isolation features may additionally or alternatively be implemented on and/or within the substrate. However, other embodiments are possible. For example, in some embodiments, the dielectric material (and subsequently formed isolation regions 302) may include a multi-layer structure, for example, having one or more liner layers. After deposition of the dielectric material, the deposited dielectric material is thinned and planarized, for example by a CMP process. In some embodiments, such a CMP process may be used to remove excess dielectric material, planarize a top surface of the device 200, and form isolation regions (e.g., which are subsequently recessed to form the isolation regions 302, as described below).

In some embodiments, the CMP process used to planarize the top surface of the device 200 and form the isolation regions (e.g., prior to recessing the isolation regions) may also serve to remove the HM layer portion 206 from each of the plurality of fin elements 204. In some embodiments, removal of the HM layer portion 206 includes removal of the oxide layer portion 208 and the nitride layer portion 210. Removal of the HM layer portion 206, including the oxide layer portion 208 and the nitride layer portion 210, may alternately be performed by using a suitable etching process (e.g., dry or wet etching). Whether by using a CMP process or an etching process, upon removal of the HM layer portion 206 from the top of each of the fin elements 204, the underlying substrate portion 202A of each of the fin elements 204 is exposed.

After the CMP process to remove the excess dielectric material and planarize the top surface of the device 200, the isolation regions around the fin elements 204 are recessed to laterally expose an upper portion 204A of the fin elements 204 and form the isolation regions 302. In various examples, the isolation regions 302 are configured to isolate fin active regions. In some embodiments, the recessing process may include a dry etching process, a wet etching process, and/or a combination thereof. In various embodiments, a recessing depth is controlled (e.g., by controlling an etching time) so as to result in a desired height 'H' of the exposed upper portion 204A of the fin elements 204. In some embodiments, the height 'H' may be between approximately 30 nm-60 nm. In some cases, a fin width 'W' may be between approximately 4 nm-10 nm.

The method 100 then proceeds to block 106 where a high-K-first process is performed. In various examples, the high-K-first process may include forming an interfacial layer, a high-K gate dielectric layer, and a metal capping layer. With reference to the example of FIGS. 3 and 4, in an embodiment of block 106, an interfacial layer 402 is formed over the exposed upper portion 204A of the fin elements 204, a high-K gate dielectric layer 404 is formed over the interfacial layer 402, and a metal capping layer 406 is formed over the high-K gate dielectric layer 404. In some embodiments, each of the interfacial layer 402, the high-K gate dielectric layer 404, and the metal capping layer 406 are formed conformally over the fin elements 204, including within trenches between adjacent fin elements 204. More detailed views of the interfacial layer 402, the high-K gate dielectric layer 404, and the metal capping layer 406 are provided below (e.g., in FIG. 5A).

In some embodiments, the interfacial layer 402 may include a dielectric material such as silicon oxide ($SiO_2$), HfSiO, or silicon oxynitride (SiON). The interfacial layer 402 may be formed by chemical oxidation, thermal oxidation, atomic layer deposition (ALD), chemical vapor deposition (CVD), and/or other suitable method. In various examples, a thickness of the interfacial layer 402 may be around 0.5-3 nm. In some embodiments, the high-K dielectric layer 404 may include hafnium oxide ($HfO_2$) or HfZrO. Alternatively, the high-K gate dielectric layer 404 may include other high-K dielectrics, such as $TiO_2$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr) $TiO_3$ (BST), $Al_2O_3$, $Si_3N_4$, oxynitrides (SiON), combinations thereof, or other suitable material. The high-K gate dielectric layer 404 may be formed by ALD, physical vapor deposition (PVD), CVD, oxidation, and/or other suitable methods. In various examples, a thickness of the high-K gate dielectric layer 404 may be around 1-5 nm.

In some embodiments, the metal capping layer 406 may include a metal nitride (such as TiN) or metal-containing composition nitrides (such as TiN—Si3N4 composition, TSN). Alternatively, in some embodiments, the metal capping layer 406 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In some cases, the metal capping layer 406 may provide an N-type or P-type work function, for example, depending on whether an N-type or P-type FinFET is being formed. In various embodiments, the metal capping layer 406 may be formed by ALD, PVD, CVD, e-beam evaporation, or other suitable process. In some examples, a thickness of the metal capping layer 406 may be around 1-3 nm.

The method 100 then proceeds to block 108 where a dummy gate electrode layer is formed. With reference to the example of FIGS. 4, 5, and 5A, in an embodiment of block 108, a dummy gate electrode layer 502 is formed over the substrate 202 and is at least partially disposed over the fin elements 204. In some embodiments, the dummy gate electrode layer 502 is formed over the metal capping layer 406 formed at block 106. In some examples, a hard mask 504 may be formed over the dummy gate electrode layer 502, where the hard mask 504 includes an oxide layer 506 and a nitride layer 508 formed over the oxide layer 506. In some examples, deposition of the dummy gate electrode layer 502 and the hard mask 504 may be accomplished using CVD, PVD, ALD, thermal oxidation, or other suitable deposition techniques, or a combination thereof. In some embodiments, the dummy gate electrode layer 502 may include polycrystalline silicon (polysilicon). In some embodiments, the oxide layer 506 includes a pad oxide layer that may include $SiO_2$. In some embodiments, the nitride layer 508 includes a pad nitride layer that may include $Si_3N_4$, silicon oxynitride or silicon carbide.

The method 100 then proceeds to block 110 where the dummy gate electrode layer is patterned. With reference to the example of FIGS. 5/5A and 6/6A, in an embodiment of block 110, the hard mask 504 and the dummy gate electrode layer 502 are patterned to form a dummy gate 602 (e.g., using photolithography and etching processes). In some embodiments, the photolithography process may include photoresist coating (e.g., over the hard mask 504), soft baking, mask aligning, exposure, post-exposure baking, photoresist developing, rinsing, drying (e.g., spin-drying and/or hard baking), and/or other suitable lithography techniques, and/or combinations thereof. The photolithography process may provide a patterned photoresist layer which serves as a masking element for the subsequent etching process. The masking element may be used to protect some regions of the device 200, while an etching process (e.g., a dry etch, a wet etch, or combination thereof) etches through unprotected regions of the device 200 including unprotected regions of the hard mask 504 and the dummy gate electrode layer 502, thereby leaving the dummy gate 602. As shown, the dummy gate 602 includes a dummy gate electrode portion 502A and a hard mask portion 504A including an oxide layer portion 506A and a nitride layer portion 508A. In some embodiments, the etching process used to form the dummy gate 602 is further configured to etch the metal capping layer 406 and stop on the high-K gate dielectric layer 404. As a result, a metal capping layer portion 406A may be disposed beneath each of the dummy gates 602. In various embodiments, the dummy gate 602 will be replaced at a later stage of processing by a metal gate electrode, as discussed below, while the metal capping layer portion 406A remains.

The method 100 then proceeds to block 112 where a first spacer layer is deposited. With reference to the example of FIGS. 6/6A and 7/7A, in an embodiment of block 112, a first spacer layer 702 is deposited over the substrate 202 including over the dummy gates 602. In some cases, the first spacer layer 702 may be referred to as an offset spacer. The first spacer layer 702 may be deposited conformally over the dummy gates 602, including on sidewalls of both the dummy gates 602 and the metal capping layer portion 406A, and over the high-K gate dielectric layer 404 within trenches between adjacent dummy gates 602. In some embodiments, the first spacer layer 702 may include a dielectric material such as silicon oxide, silicon nitride, silicon carbide, silicon oxynitride, SiOC, SiOCN, a low-K dielectric material, or combinations thereof. The first spacer layer 702 may be formed by chemical oxidation, thermal oxidation, ALD, CVD, and/or other suitable method. In various examples, a thickness of the first spacer layer 702 may be around 1-8 nm. In some embodiments, the thickness of the first spacer layer 702 may be tuned to control a length of the high-K footing extending beneath the first spacer layer 702. As discussed below with reference to FIG. 12B, by providing the high-K footing, a capacitive fringing field between a metal gate electrode and a device channel region is improved, thereby improving the gate-to-channel coupling and drain current (Ideff) of the device.

The method 100 then proceeds to block 114 where the first spacer layer, high-K gate dielectric layer, and interfacial layer are etched-back (or pulled-back). With reference to the example of FIGS. 7/7A and 8/8A, in an embodiment of block 114, the first spacer layer 702, the high-K gate dielectric layer 404, and the interfacial layer 402 are etched-back to expose portions of the fin elements 204 not covered by the dummy gates 602. However, portions of the first spacer layer 702A remain on sidewalls of both the dummy gates 602 and the metal capping layer portion 406A. In addition, after the etch-back process, a high-K gate dielectric layer portion 404A and an interfacial layer portion 402A remain disposed beneath the dummy gates 602 and beneath the portions of the first spacer layer 702A on sidewalls of the dummy gates 602. The etch-back process may also remove a portion of the first spacer layer 702 along a top surface of the dummy gates 602, exposing the nitride layer portion 508A. In some embodiments, the etch-back process may include a wet etch process, a dry etch process, a multiple-step etch process, and/or a combination thereof.

The method 100 then proceeds to block 116 where a second spacer layer is deposited. With reference to the example of FIGS. 8 and 9, in an embodiment of block 116, a second spacer layer 902 is deposited over the substrate 202 including over the dummy gates 602. The second spacer layer 902 may be deposited conformally over the dummy gates 602, including over the portions of the first spacer layer 702A, on sidewalls of the high-K gate dielectric layer portion 404A and the interfacial layer portion 402A, and over the portions of the fin elements 204 exposed during the etch-back process of block 114. In some embodiments, the second spacer layer 902 may include a dielectric material such as silicon oxide, silicon nitride, silicon carbide, silicon oxynitride, SiOC, SiOCN, a low-K dielectric material, or combinations thereof. The second spacer layer 902 may be formed by chemical oxidation, thermal oxidation, ALD, CVD, and/or other suitable method. In various examples, a thickness of the second spacer layer 902 may be around 1-8 nm.

The method 100 then proceeds to block 118 where the second spacer layer is etched-back. With reference to the example of FIGS. 9 and 10, in an embodiment of block 118, the second spacer layer 902 is etched-back to expose portions of the fin elements 204 not covered by the dummy gates 602. However, portions of the second spacer layer 902A remain on the portions of the first spacer layer 702A (e.g., on sidewalls of the dummy gates 602), and on the sidewalls of the high-K gate dielectric layer portion 404A and the interfacial layer portion 402A. The etch-back process may also remove a portion of the second spacer layer 902 along a top surface of the dummy gates 602, exposing the nitride layer portion 508A. In some embodiments, the etch-back process may include a wet etch process, a dry etch process, a multiple-step etch process, and/or a combination thereof.

The method 100 then proceeds to block 120 where source/drain features are formed. Still referring to the example of FIGS. 9 and 10, in an embodiment of block 120, source/drain features 1002, 1004 are formed in source/drain regions 1006, 1008. In some embodiments, the source/drain features 1002, 1004 are formed by epitaxially growing a semiconductor material layer in the source/drain regions 1006, 1008, for example, on and/or around the portions of the fin elements 204 exposed during the etch-back process of block 118. In some examples, source/drain features epitaxially grown over adjacent fin elements (e.g., in the source region or drain region) may merge to form a single, merged source/drain feature such as the source/drain features 1002, 1004. However, in some embodiments, source/drain features epitaxially grown over adjacent fin elements (e.g., in the source or drain region) may not merge such that the source and/or drain regions includes a plurality of separate source and/or drain features adjacent to one another.

In various embodiments, the source/drain features 1002, 1004 may include Ge, Si, GaAs, AlGaAs, SiGe, GaAsP, SiP, or other suitable material. In some embodiments, the source/drain features 1002, 1004 may be in-situ doped during the epi process. For example, in some embodiments, epitaxially grown SiGe source/drain features 1002, 1004 may be doped with boron. In some embodiments, epitaxially grown Si epi source/drain features 1002, 1004 may be doped with carbon to form Si:C source/drain features, phosphorous to form Si:P source/drain features, or both carbon and phosphorous to form SiCP source/drain features. In some embodiments, the source/drain features 1002, 1004 are not in-situ doped, and instead an implantation process is performed to dope the source/drain features 1002, 1004. In some embodiments, formation of the source/drain features 1002, 1004 may be performed in separate processing sequences for each of N-type and P-type source/drain features 1002, 1004. In some examples, after formation of the source/drain features 1002, 1004, an epi anneal process may be performed. In some embodiments, after exposing the portions of the fin elements 204 (e.g., during the etch-back process of block 118), at least part of the exposed fin elements 204 may be etched-back and the source/drain features 1002, 1004 may be epitaxially grown over the etched-back fin elements 204.

The method 100 then proceeds to block 122 where a contact etch stop layer (CESL) and an inter-layer dielectric (ILD) layer are formed. Referring to the example of FIGS. 10 and 11, in an embodiment of block 122, a CESL 1102 and an ILD layer 1104 are formed over the substrate 202. The CESL 1102 may be disposed at least partially over the portions of the second spacer layer 902A and the source/drain features 1002, 1004, and the ILD layer 1104 may be disposed over the CESL 1102. In some examples, the CESL 1102 includes a silicon nitride layer, silicon oxide layer, a silicon oxynitride layer, and/or other materials known in the art. The CESL 1102 may be formed by CVD, ALD, or other suitable process. In some embodiments, the ILD layer 1104 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1104 may be deposited by CVD, ALD, or other suitable process. In some embodiments, after formation of the ILD layer 1104, an anneal process may be performed to anneal the ILD layer 1104. In some examples, after deposition of the CESL 1102 and the ILD layer 1104, a planarization process may be performed to expose a top surface of the dummy gate 602. The planarization process may include a chemical mechanical planarization (CMP) process which removes portions of the CESL 1102 and the ILD layer 1104 overlying the dummy gate 602 and planarizes a top surface of the semiconductor device 200. The CMP process may also remove the hard mask portion 504A of the dummy gate 602 including the oxide layer portion 506A and the nitride layer portion 508A to expose the dummy gate electrode portion 502A, which may include a polysilicon layer, as discussed above.

Figure 8A:
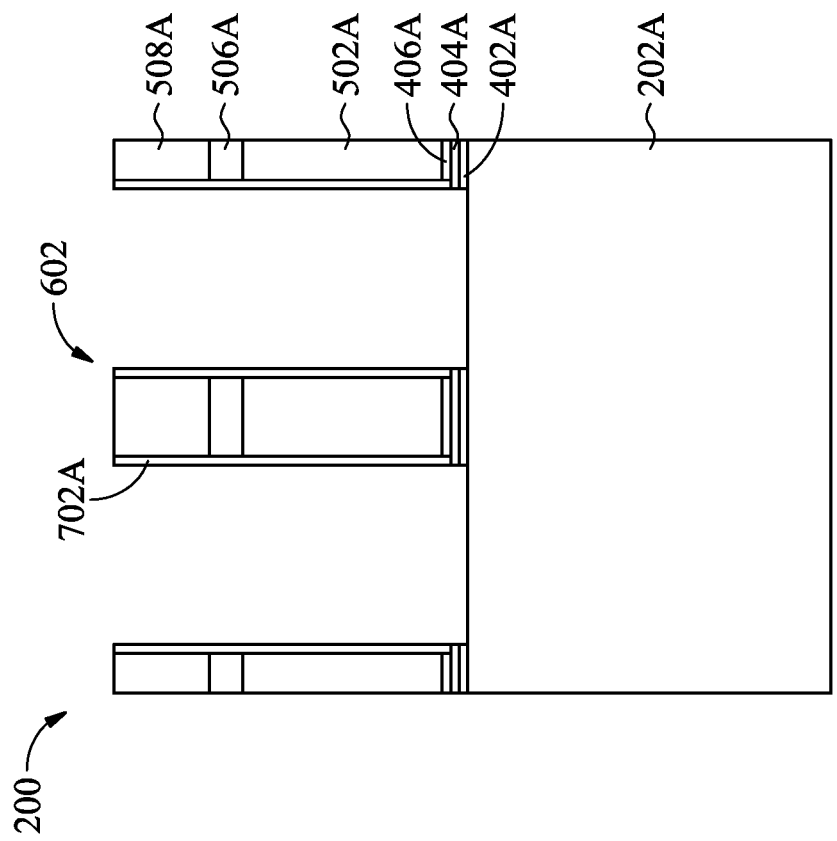
Figure 8:
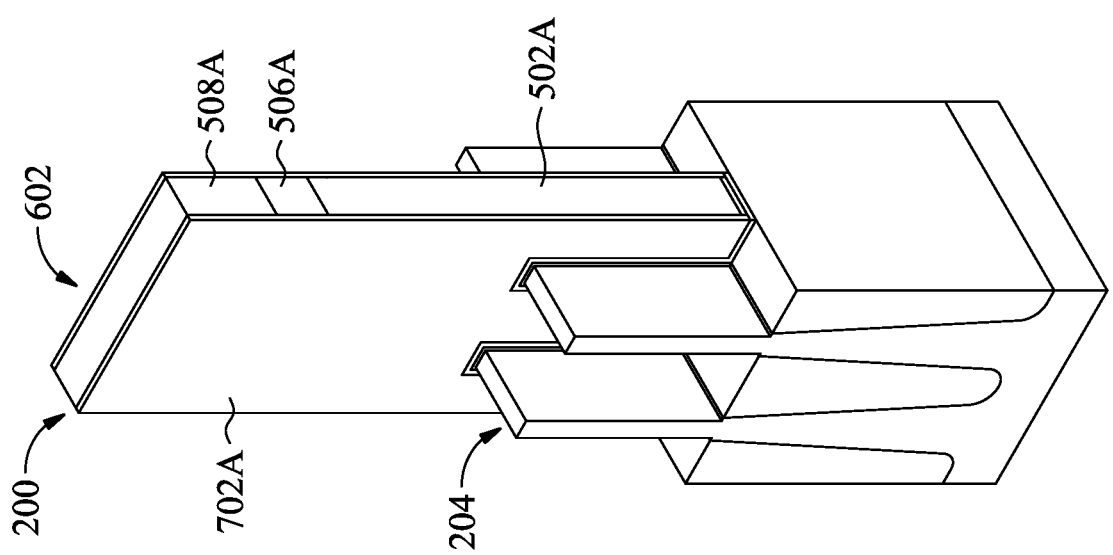
Figure 10:
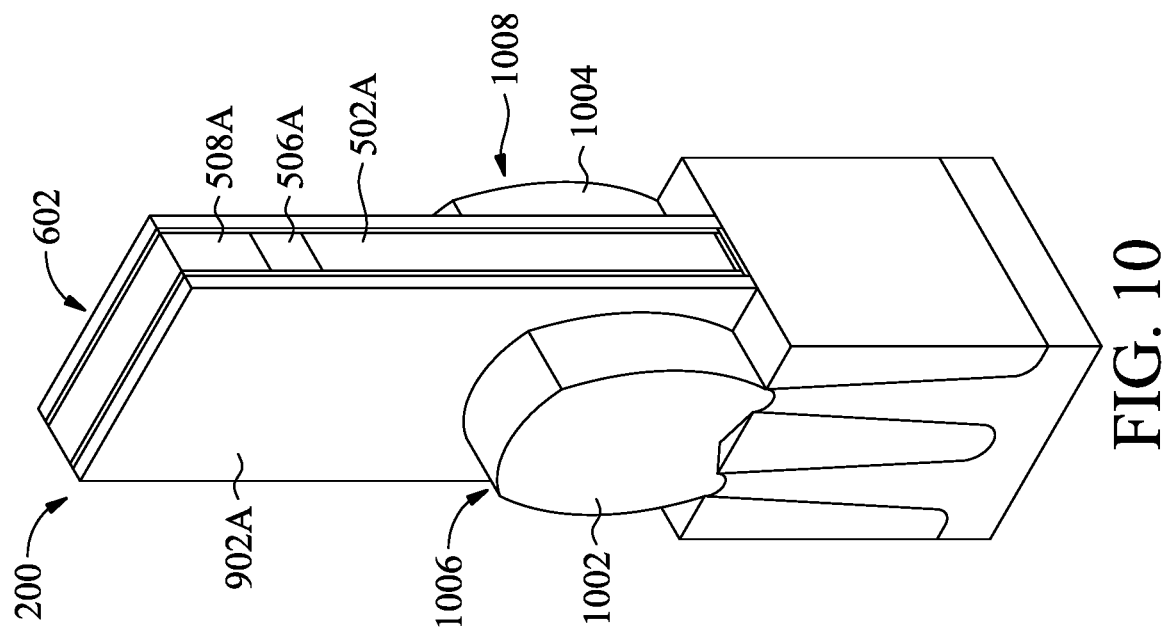
Figure 9:
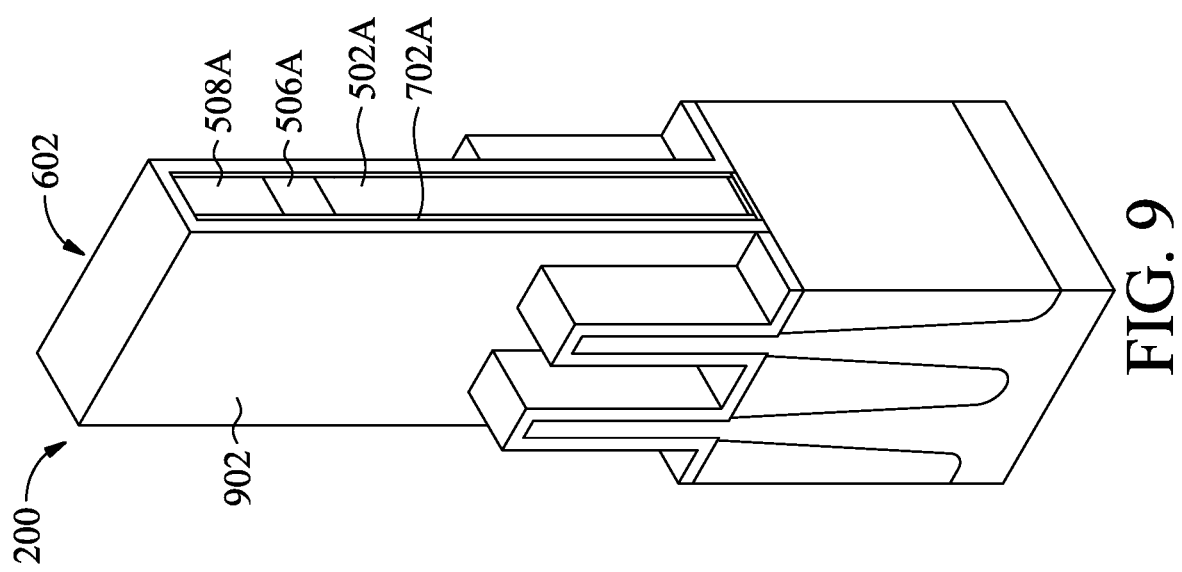

The method 100 then proceeds to block 124 where the dummy gate electrode is removed and replaced with a metal gate electrode. Referring to the example of FIGS. 11 and 12, in an embodiment of block 124, the dummy gate electrode portion 502A may be removed from the substrate. The removal of the dummy gate electrode portion 502A may be performed using a selective etching process such as a selective wet etch, a selective dry etch, or a combination thereof. In some embodiments, the dummy gate electrode portion 502A may be removed to expose the metal capping layer portion 406A (FIG. 8A). In addition, the removal of the dummy gate electrode portion 502A and exposure of the metal capping layer portion 406A may result in a trench having sidewalls including the portions of the first spacer layer 702A. After removal of the dummy gate electrode portion 502A, and in some embodiments, a metal gate electrode 1202 may be formed in the trench and on the metal capping layer portion 406A, as shown in FIG. 12, to form a final gate structure 1204. In various examples, the substrate portion 202A beneath the gate structure 1204 will serve as the FinFET device channel.

In various examples, the metal gate electrode 1202 may include a metal, metal alloy, or metal silicide. The metal gate electrode 1202 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal gate electrode 1202 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In addition, the metal gate electrode 1202 may provide an N-type or P-type work function, may serve as a transistor (e.g., FinFET) gate electrode. In various embodiments, the metal gate electrode 1202 may be formed by ALD, PVD, CVD, e-beam evaporation, or other suitable process. Further, the metal gate electrode 1202 may be formed separately for N-FET and P-FET transistors which may use different metal layers. In various embodiments, a CMP process may be performed to remove excessive metal from the metal gate electrode 1202, and thereby provide a substantially planar top surface of the metal gate electrode 1202 and of the device 200.

The semiconductor device 200 may undergo further processing to form various features and regions known in the art. For example, subsequent processing may form interlayer dielectric (ILD) layer(s), contact openings, contact metal, as well as various contacts/vias/lines and multilayers interconnect features (e.g., metal layers and interlayer dielectrics) on the substrate 202, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multi-layer interconnection structure. Moreover, additional process steps may be implemented before, during, and after the method 100, and some process steps described above may be replaced or eliminated in accordance with various embodiments of the method 100.

FIG. 12A shows a cross-section view (e.g., along the exemplary plane A-A', as shown in FIG. 4), corresponding to the isometric view of FIG. 12, which provides a more detailed view of a final structure of the device 200 as manufactured according to the method 100. In particular, to more clearly illustrate the high-K footing described herein, FIG. 12B provides a zoomed-in view of a region 1206 of the device 200 of FIG. 12A that includes the high-K footing. With respect to the gate structure 1204, FIG. 12B illustrates the metal gate electrode 1202 disposed over the metal capping layer portion 406A, with the portions of the first spacer layer 702A on sidewalls of the metal gate electrode 1202 and the metal capping layer portion 406A. In addition, the high-K gate dielectric layer portion 404A and the interfacial layer portion 402A are disposed beneath the metal gate electrode 1202 and beneath the portions of the first spacer layer 702A. Stated another way, the high-K gate dielectric layer portion 404A and the interfacial layer portion 402A extend laterally beneath the portions of the first spacer layer 702A, to provide the high-K footing. As previously noted, the thickness of the portions of the first spacer layer 702A may be tuned to control a length 'L' of the high-K footing.

By providing the high-K footing, and in accordance with various embodiments, a capacitive fringing field (schematically indicated by arrow B-B') between the metal gate electrode 1202 and the channel region beneath the gate structure 1204 is improved, thereby improving the gate-to-channel coupling and drain current (Ideff) of the device 200. It will be understood that depending on the thickness of the portions of the first spacer layer 702A, the capacitive fringing field may have different profiles. For instance, a thicker first spacer layer 702A (and thus longer high-K footing length 'L') may provide a different capacitive fringing field (schematically indicated by arrow B-C') between the metal gate electrode 1202 and the channel region beneath the gate structure 1204. In other cases, a thinner first spacer layer 702A (and thus shorter high-K footing length 'L') may provide another capacitive fringing field (schematically indicated by arrow B-D') between the metal gate electrode 1202 and the channel region beneath the gate structure 1204. Regardless of the precise thickness of the first spacer layer 702A (and corresponding high-K footing length 'L'), embodiments of the present disclosure are configured to provide improved gate-to-channel coupling and drain current (Ideff) of the device 200.

Thus, the various embodiments described herein offer several advantages over the existing art. It will be understood that not all advantages have been necessarily discussed herein, no particular advantage is required for all embodiments, and other embodiments may offer different advantages. For example, embodiments discussed herein provide a method and related structure for improving a gate-to-channel fringing field for devices fabricated using a high-K-first process by employing a high-K footing that extends under a gate stack spacer. In some embodiments, the high-K-first process disclosed herein provides the high-K footing having a structure including an interfacial layer and a high-K dielectric layer that extend laterally under a sidewall spacer of the gate stack. In accordance with some examples, devices fabricated using a high-K-first process and with such a high-K footing may exhibit a drain current (Ideff) that is comparable to that of devices fabricated using a high-K-last process. Generally, aspects of the present disclosure provide a process that is compatible with a conventional seal spacer process, provide for tuning a length of the high-K footing by tuning an offset spacer (e.g., sidewall spacer) thickness, and the drive current of high-K-first devices including the disclosed high-K footing structure is improved due to the improved gate-to-channel fringing field. Further, the devices structures and related methods discussed herein simultaneously offer advantages of both a high-K-first process (e.g., better process window and lower Cgd) and a high-K-last process (e.g., improved gate-to-channel coupling and Ideff). Additional embodiments and advantages will be evident to those skilled in the art in possession of this disclosure.

Thus, one of the embodiments of the present disclosure described a method including forming a plurality of fin elements extending from a substrate. In some embodiments, a dielectric layer is deposited over each of the plurality of fin elements. After depositing the dielectric layer, a dummy gate electrode is formed over the plurality of fin elements and over the dielectric layer. In some examples, and after forming the dummy gate electrode, a first spacer layer is formed on opposing sidewalls of the dummy gate electrode and over the dielectric layer. In various embodiments, the dielectric layer extends laterally beneath the first spacer layer on each of the opposing sidewalls of the dummy gate electrode.

In another of the embodiments, discussed is a method including forming a plurality of fin elements extending from a substrate and forming a gate structure over each of the plurality of fin elements. In some embodiments, the gate structure includes a dielectric layer portion, a metal capping layer portion over the dielectric layer portion, and a dummy electrode over the metal capping layer portion. In some examples, a first spacer layer is deposited on opposing sidewalls of both the dummy electrode and the metal capping layer portion, where an end of the dielectric layer portion extends beneath the first spacer layer.

In yet another of the embodiments, discussed is a semiconductor device including a substrate having a fin element extending therefrom. In some embodiments, a gate structure is formed over the fin element, where the gate structure includes a dielectric layer on the fin element, a metal capping layer disposed over the dielectric layer, and a metal electrode formed over the metal capping layer. In some cases, first sidewall spacers are formed on opposing sidewalls of the metal capping layer and the metal electrode. In various embodiments, the dielectric layer extends laterally underneath the first sidewall spacers to form a dielectric footing region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate including a fin element extending therefrom;
    a gate structure formed over the fin element, wherein the gate structure includes a dielectric layer on the fin element, a metal capping layer disposed over the dielectric layer, and a metal electrode formed over the metal capping layer; and
    first sidewall spacers formed on opposing sidewalls of the metal capping layer and the metal electrode;
    wherein the dielectric layer includes an interfacial layer formed over the fin element and a high-K dielectric layer formed over the interfacial layer, and wherein the interfacial layer and the high-K dielectric layer extend laterally underneath the first sidewall spacers to form a dielectric footing region.

2. The semiconductor device of claim 1, wherein a length of the dielectric footing region is substantially equal to a thickness of the first sidewall spacers.

3. The semiconductor device of claim 1, further comprising:
    second sidewall spacers formed on the first sidewall spacers and on sidewalls of the dielectric layer.

4. The semiconductor device of claim 1, wherein first sidewall spacers include SiN, SiOC, or a low-K material, wherein the metal capping layer includes TiN or TSN, and wherein the dielectric layer includes $HfO_2$ or HfZrO.

5. The semiconductor device of claim 1, further comprising:
    source/drain features disposed over portions of the fin element within source/drain regions adjacent to the gate structure.

6. The semiconductor device of claim 1, wherein a portion of the dielectric layer that defines the dielectric footing region is in contact with a bottom surface of the first sidewall spacers.

7. The semiconductor device of claim 1, wherein the dielectric footing region provides a capacitive coupling between the metal electrode and a channel region within the fin element, and wherein the capacitive coupling is proportional to a thickness of the first sidewall spacers.

8. The semiconductor device of claim 3, wherein the first sidewall spacers and the second sidewall spacers are composed of a same material.

9. A device, comprising:
    a plurality of fins extending from a substrate;
    a first gate structure disposed over a first fin of the plurality of fins, wherein the first gate structure includes a first interfacial layer over the first fin, a first high-K dielectric layer over the first interfacial layer, and a first metal electrode over the first high-K dielectric layer, and wherein a first sidewall spacer is disposed along a first sidewall of the first metal electrode;
    a second gate structure disposed over a second fin of the plurality of fins, wherein the second gate structure includes a second high-K dielectric layer over the second fin and a second metal electrode over the second high-K dielectric layer, and wherein a second sidewall spacer is disposed along a second sidewall of the second metal electrode;
    wherein the first interfacial layer and the first high-K dielectric layer extend laterally underneath the first sidewall spacer to provide a first high-K footing region;
    wherein the second high-K dielectric layer extends laterally underneath the second sidewall spacer to provide a second high-K footing region; and
    wherein a first portion of the first high-K dielectric layer that extends laterally underneath the first sidewall spacer contacts a first bottom surface of the first sidewall spacer.

10. The device of claim 9, wherein a first length of the first high-K footing region is substantially equal to a first thickness of the first sidewall spacer, and wherein a second length of the second high-K footing region is substantially equal to a second thickness of the second sidewall spacer.

11. The device of claim 9, wherein a first capacitive coupling between the first metal electrode and a first channel region within the first fin is the same as a second capacitive coupling between the second metal electrode and a second channel region within the second fin.

12. The device of claim 9, wherein a first capacitive coupling between the first metal electrode and a first channel region within the first fin is different than a second capacitive coupling between the second metal electrode and a second channel region within the second fin.

13. The device of claim 9, wherein the second gate structure further includes a second interfacial layer interposing the second fin and the second high-K dielectric layer, and wherein the second interfacial layer extends laterally underneath the second sidewall spacer to provide the second high-K footing region.

14. The device of claim 9, wherein a second portion of the second high-K dielectric layer that extends laterally underneath the second sidewall spacer contacts a second bottom surface of the second sidewall spacer.

15. The device of claim 9, wherein the first gate structure further includes a first metal capping layer interposing the first high-K dielectric layer and the first metal electrode, and wherein the first sidewall spacer is disposed on sidewalls of the first metal capping layer.

16. The device of claim 9, wherein the second gate structure further includes a second metal capping layer interposing the second high-K dielectric layer and the second metal electrode, and wherein the second sidewall spacer is disposed on sidewalls of the second metal capping layer.

17. A semiconductor device, comprising:
    a fin element extending from a substrate;
    a gate stack disposed over the fin element; and
    sidewall spacers disposed on opposing sidewalls of the gate stack;
    wherein the gate stack includes an interfacial layer disposed over the fin element, a high-K dielectric layer formed over the interfacial layer, a nitrogen-containing metal capping layer formed over the high-K dielectric layer, and a metal electrode formed over the nitrogen-containing metal capping layer; and
    wherein the interfacial layer and the high-K dielectric layer extend laterally underneath the sidewall spacers to provide a dielectric footing region, and wherein a bottom surface of the sidewall spacers contacts a top surface of the high-K dielectric layer.

18. The semiconductor device of claim 17, wherein a length of the dielectric footing region is substantially equal to a thickness of the sidewall spacers.

19. The semiconductor device of claim 1, wherein the metal capping layer includes a nitrogen-containing metal capping layer.

20. The device of claim 15, wherein the first metal capping layer includes a nitrogen-containing metal capping layer.

* * * * *